United States Patent [19]
Li

[11] Patent Number: 5,610,486
[45] Date of Patent: Mar. 11, 1997

[54] CURRENT MIRROR CIRCUIT USED IN A COIL DRIVER CIRCUIT OF A BRUSHLESS DC MOTOR

[75] Inventor: Larry B. Li, San Jose, Calif.

[73] Assignee: SGS-Thomson Microelectronics, Inc., Carrollton, Tex.

[21] Appl. No.: 396,424

[22] Filed: Feb. 28, 1995

[51] Int. Cl.$^6$ ............................... H02K 29/04; H02P 1/22
[52] U.S. Cl. .................... 318/439; 318/138; 318/254
[58] Field of Search ..................... 318/138, 139, 318/254, 293, 256, 280, 287, 291, 434, 245, 432, 439; 388/811, 815, 910; 330/298, 257, 265, 267; 323/280, 277, 275

[56] References Cited

U.S. PATENT DOCUMENTS

| | | | |
|---|---|---|---|
| 4,234,835 | 11/1980 | Ota et al. | 318/317 |
| 4,453,115 | 6/1984 | Yoshida | 318/434 |
| 4,459,520 | 7/1984 | Wada | 318/254 |
| 4,788,478 | 11/1988 | Ishii et al. | 318/345 B |
| 4,868,485 | 9/1989 | Ashizaki | 323/316 |
| 4,947,091 | 8/1990 | Fukuoka | 318/434 |
| 5,017,845 | 5/1991 | Carobolante et al. | 318/138 |
| 5,032,774 | 7/1991 | Juzswik | 318/293 |
| 5,103,148 | 4/1992 | Berringer et al. | 318/432 |
| 5,172,036 | 12/1992 | Cameron | 318/138 |
| 5,191,269 | 3/1993 | Carobolante | 318/254 |
| 5,210,475 | 5/1993 | Juzswik et al. | 318/293 |
| 5,221,881 | 6/1993 | Cameron | 318/254 |
| 5,230,035 | 7/1993 | Spring | 388/815 |
| 5,306,988 | 4/1994 | Carobolante et al. | 318/254 |
| 5,331,259 | 7/1994 | Naito | 318/254 |
| 5,374,880 | 12/1994 | Kondoh et al. | 318/254 |
| 5,397,967 | 3/1995 | Carobolante et al. | 388/800 |

FOREIGN PATENT DOCUMENTS 3611548  8/1987  Netherlands .

*Primary Examiner*—Paul Ip
*Attorney, Agent, or Firm*—Joseph C. Arrambide; Theodore E. Galanthay; Irena Lager

[57] ABSTRACT

A stator coil driver circuit for a brushless DC motor, with an improved current mirror, is disclosed. The improved current mirror has a first transistor which conducts current and a second transistor configured to mirror the current of the first transistor. Additionally, the improved mirror circuit includes a unity gain amplifier connected in between the gates of the first and second transistor. The effect of the unity gain transistor is to provide for a faster turn-off of the second transistor and reduce oscillation of the circuit.

21 Claims, 3 Drawing Sheets

5,610,486

CURRENT MIRROR CIRCUIT USED IN A COIL DRIVER CIRCUIT OF A BRUSHLESS DC MOTOR

BACKGROUND OF THE INVENTION

1. FIELD OF THE INVENTION

The present invention relates to a brushless direct current motors, and in particular, to the stator coil driver circuitry for the brushless direct current motor, and still more particularly to a current mirror circuit for the driver circuit.

2. TECHNICAL BACKGROUND

Brushless direct current motors (DC motors) are commonly used in disk drives, tape drives, video cassette players, and the like and are typically under stringent requirements regarding their performance in these applications.

FIG. 1 illustrates the typical architecture of a brushless DC motor as is known in the art. This architecture includes a motor 12, a commutator 20, a driver 22, and a voltage supply 24. The motor includes a rotor 14, a stator 16, and Hall effect sensors 103. (Although this block diagram shows Hall effect sensors, it is also known in the art to use the back electromotive force, BEMF, of a floating coil to determine the position of the rotor instead of using Hall effect sensors.) The stator 16 includes stator coils 26a, 26b, and 26c configured in a wye configuration. In operation, the commutator block 20 sequentially selects the appropriate stator coil driver circuit in driver block 22 to drive current into or out of stator coils 26a, 26b, or 26c, as is known in the art. Hall effect sensors 103, in combination with rotor 14, provide the position information necessary so that the commutator 20 can commutate the driver circuit 22 at the appropriate time. The operation of a typical disk drive is more fully described in U.S. Pat. Nos. 5,017,845, 5,172,036, 5,191,269, 5,221,881, and 5,306,988, and are fully incorporated into this specification by reference.

FIG. 2 shows a prior art driver circuit 10 used to drive current into the stator coils of motor 12. The commutation phase "a" signal (control logic signal) comes from commutator 20 and enters the driver circuit at the base of NPN transistor 108. The PWM/linear mode signal enters the circuit at the gate of transistor 115. The current through transistor 108 is mirrored by transistors 112 and 114. When the PWM/Linear signal is high and transistor 115 is conducting, transistor 118 is configured to mirror the current in transistor 116. Alternatively, if the PWM/Linear signal is low and transistor 115 is not conducting, the gate of transistor 118 is driven by the current provided for by transistor 114.

Typically, transistor 118 is a DMOS power transistor with a large parasitic capacitance between its gate and drain. It has been observed that the circuit tends to oscillate when the phase is off since the large parasitic capacitance is exposed to a high impedance (transistor 114 and 116 in the off state) which forms a large RC time constant. Additionally, it has been observed that transistor 118 turns off slowly, largely because of the difference in size between transistor 116 and 118 and also because of the high output impedance of the transistors 114 and 116 in the disclosed configuration. With the high input impedance, there is no discharge path for the gate of transistor 118 and therefore it turns off at a relatively slow speed.

SUMMARY OF THE INVENTION

Therefore, it is an object of the invention to decrease the turn-off and turn-on time of the driver circuit.

It is another object of the invention to reduce the oscillation of the circuit when the phase is off.

These and other objects, features, and advantages of the invention will be apparent to those skilled in the art from the following detailed description of the invention, when read with the drawings and appended claims.

To achieve the objects, an improved current mirror circuit is disclosed and is incorporated into the driver circuit of a disk drive. The improved current mirror includes a unity gain amplifier connected between the mirror transistors and is functionally used to drive the current onto and off of the gate of the power transistor. The unity gain amplifier is constructed with a high impedance input stage and a low impedance output stage, and is designed to have a high frequency response of around than 80 Mhz.

DETAILED DESCRIPTION OF THE PREFERRED EMBODIMENT

Figure 3:
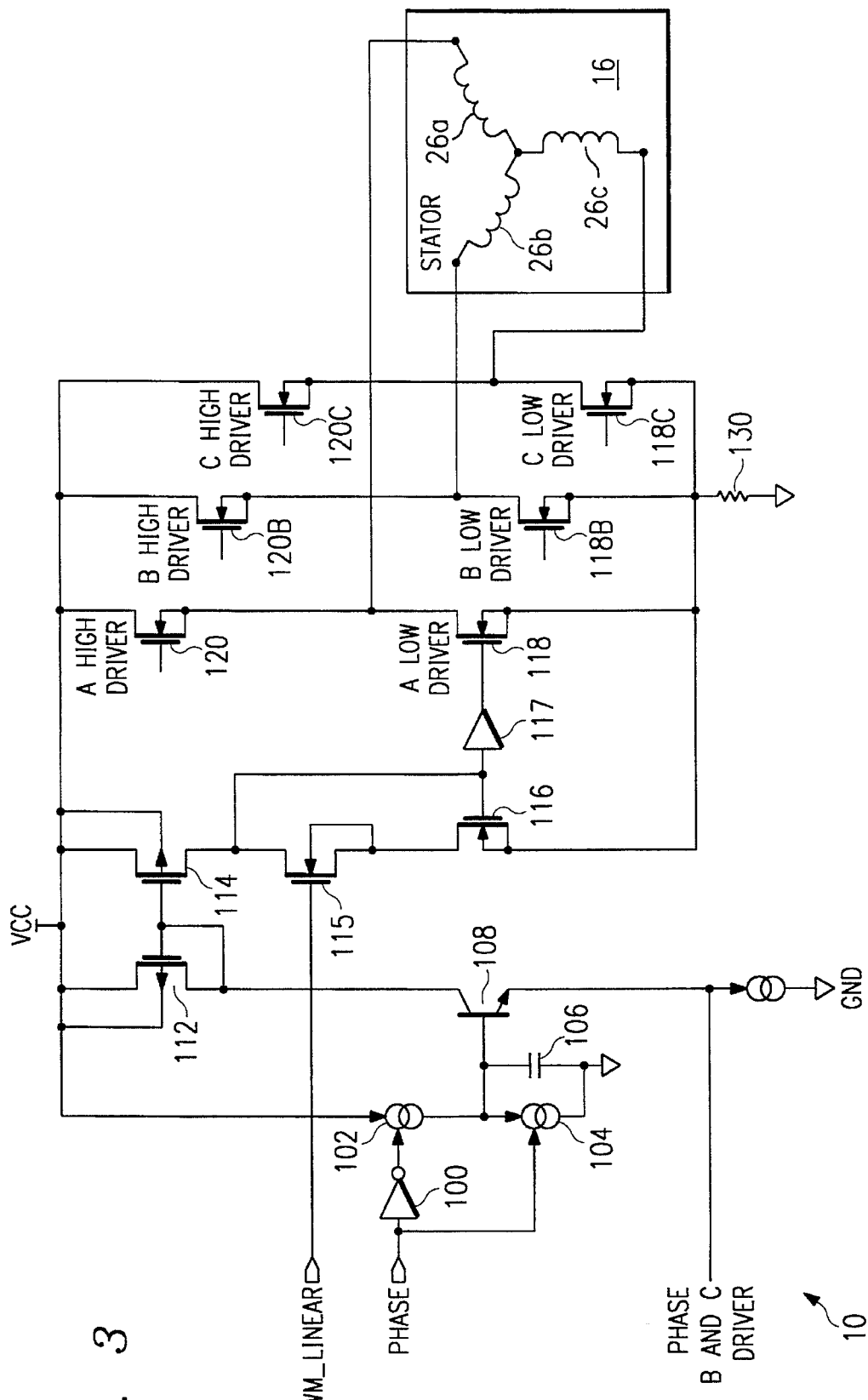
FIG. 3 is a schematic diagram of the preferred embodiment of a driver circuit, including a unity gain amplifier.

A stator coil driver circuit constructed according to the preferred embodiment of the invention will be described. Referring now to FIG. 3, the stator coils 26a, 26b, and 26c are connected in a wye configuration. The only the driver circuit for coil 26a is shown since it is understood that typically three drive circuits would be preferable for driving coils in this wye configuration. The driver circuit for coil 26b and 26c would be constructed in an analogous manner as the driver circuit for coil 26a.

The driver circuit for coil 26a includes inverter 100, which has an input for receiving a coil A control logic signal and an output which is connected to the control element of current source 102. Current source 102 has a draining end connected to a supply voltage, Vdd, and a sourcing end connected to a draining end of current source 104, a first plate of capacitor 106, and a gate of n-channel MOSFET transistor 108. Current source 104 has a control element connected to the input of inverter 100 and has a source end connected to a voltage reference, ground. The second plate of capacitor 106 is connected to ground. Transistor 108 has a drain connected to a current mirror which is made up from p-channel MOSFET transistor 112 and p-channel MOSFET transistor 114. The source of transistor 108 is connected to a first end of current source I148. The drain of transistor 108 is connected to the drain and gate of transistor 112 and the gate of transistor 114. The source of transistor 112 and 114 are connected to Vdd. The drain of transistor 114 is connected to the drain and gate of n-channel MOSFET transistor 116 and the input of unity gain buffer amplifier 117. The output of unity gain amplifier 117 is connected to the gate of n-channel MOSFET transistor 118. Transistor 116, amplifier 117, and transistor 118 form the second current mirror where the amplifier improves the performance of the current mirror. The drain of transistor 118 is connected to the source of n-channel MOSFET transistor 120 and to one end of coil 26a. Transistor 120 is the high-side driver transistor and transistor 118 is the low-side driver for coil 26a. The high-side driver is shown as unconnected although it is understood in the art that its gate would be connected to high-side driver circuitry, as is known in the art. The sources of transistor 116 and 118 are connected to the first end of sense resistor 130. The second end of sense resistor 130 is connected to ground.

In operation, the coil 26a control logic signal controls current source 102 and 104 so that capacitor 106 begins to charge when coil 26a is selected by the commutator 20. As capacitor 106 is charged, the current through transistor 108 increases and is mirrored by transistors 114 and 115. If the PWM/Linear signal is high and transistor 115 is on, the current in transistor 114 is conducted through transistor 116, thereby generating a voltage on the gate of transistor 116 and the input of amplifier 117. The amplifier 117 applies the input voltage on to the gate of transistor 118 by providing current amplification. In this embodiment, the amplifier 117 has a high bandwidth of around 80 MHz, low output impedance of less than or equal to 300 ohms, and unity gain. It is understood in the art that non-unity gain amplifiers with differing characteristics, such as larger or smaller bandwidth or different output impedances, can be used in this application without departing from the spirit and scope of the invention.

Figure 1:
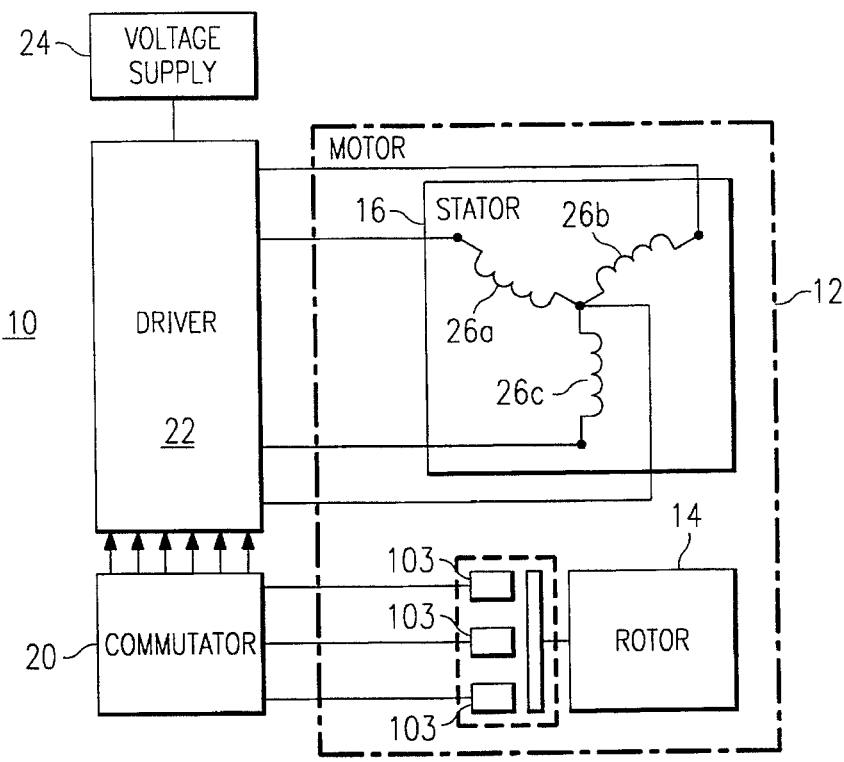
FIG. 1 is an a block diagram of a DC motor control circuit.
Figure 4:
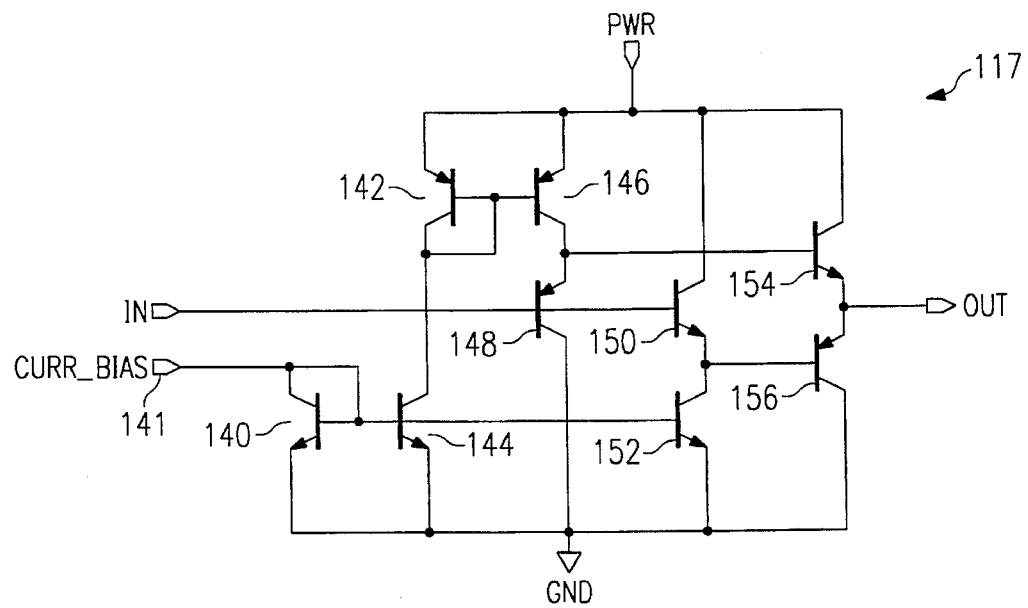
FIG. 4 is a schematic diagram of a unity gain amplifier.
Figure 2:
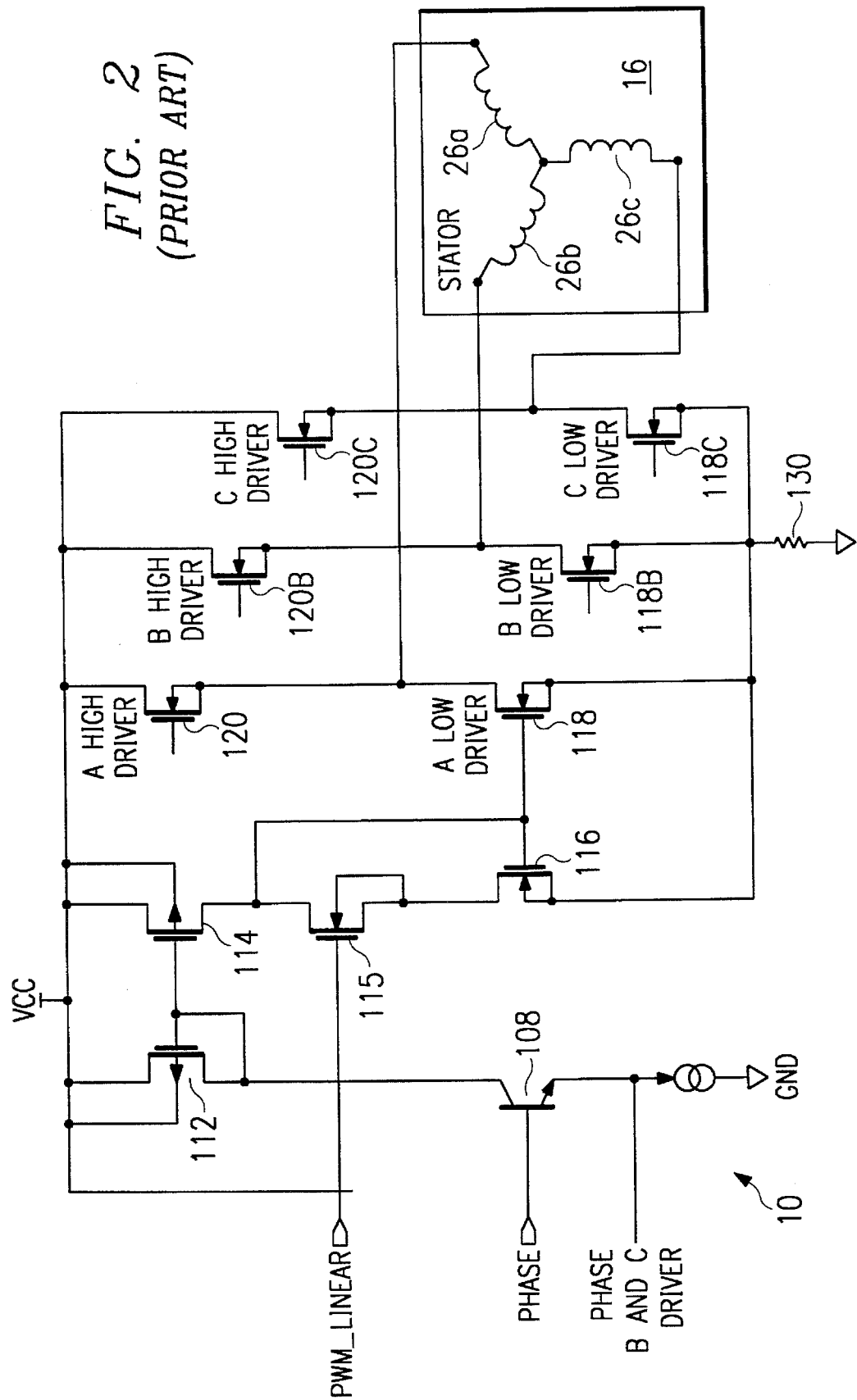
FIG. 2 is a schematic diagram of a prior art driver circuit.

FIG. 4 shows the detailed construction of amplifier 117. The collector and base of NPN transistor 140, the base of NPN transistor 144, and the base of NPN transistor 152 are connected to a current bias pin 141 which receives an external bias current. The external bias current can range from 20 to 50 microamps and is typically set for around 30 microamps. The emitters of transistors 140, 144, and 152 are connected to ground. The collector of transistor 144 is connected to the collector and base of PNP transistor 142 and to the base of PNP transistor 146. The emitters of transistors 142 and 146 are connected to a power source Vcc. The collector of transistor 146 is connected the base of NPN transistor 154 and to the emitter of PNP transistor 148. The input of the amplifier 117 is connected to the bases of transistors 148. The emitter of transistor 150 is connected to the base of PNP transistor 156 and the collector of transistor 152. The collectors of transistors 150 and 154 are connected to Vcc. The collector of transistor 156 is connected to ground. The emitters of transistors 154 and 156 are connected to form the output of amplifier 117.

In operation, transistors 148 and 150 form the input stage of amplifier 117. Transistors 140, 142, 144, 146, and 152 form a current bias circuit which provides the current bias for the input stage and an output stage of amplifier 117. Transistors 154 and 156 form the output stage of the amplifier 117. More specifically, an input signal stage enters the amplifier through the bases of transistors 148 and 150. As the input signal rises in voltage, transistor 148 is less forward biased while transistor 150 is more forward biased. Consequently, transistor 154 is more forward biased by the current of transistor 146 since transistor 148 is not conducting the current. Additionally, transistor 156 is less forward biased since transistor 150 is adding current to the base of transistor 156. Therefore, the output of amplifier 117 follows the input signal.

Conversely, as the input signal falls, transistor 148 is more forward biased while transistor 150 is less forward biased. Consequently, transistor 154 is less forward biased and transistor 156 is more forward biased, which lowers voltage on the output of amplifier 117.

The amplifier 117, when used in combination with transistor 116 and transistor 118 of FIG. 3, has been observed to decrease the turn-off and turn-on time of the driver circuit and to reduce the oscillation of the driver circuit when the phase is off.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A current mirror comprising:
    a first transistor having a conductive path with a first end and a second end and having a first transistor control element connected to the first end of the conductive path;
    an amplifier having an input connected to the first transistor control element and the first input of the first transistor, and having an output; and
    a second transistor having a conductive path and having a second transistor control element connected to the output of the amplifier so that the current flowing in the conductive path of the first transistor is mirrored in the conductive path of the second transistor.

2. The current mirror circuit of claim 1 wherein the amplifier has substantially a unity gain.

3. The current mirror circuit of claim 1 wherein the amplifier comprises an amplifier with a bandwidth of 80 MHz.

4. The current mirror circuit of claim 1 wherein the amplifier has a low output impedance.

5. The current mirror circuit of claim 1 wherein the amplifier comprises:
    an input stage for receiving an input signal;
    an output stage connected to the input stage for buffering the input signal; and
    a bias circuit for providing bias current to the input stage and the output stage.

6. The current mirror circuit of claim 5 wherein the input stage comprises a PNP transistor and a NPN transistor, wherein the base of the PNP transistor and the base of the NPN transistor receive the input signal.

7. The current mirror circuit of claim 5 wherein the output stage comprises a NPN transistor and a PNP transistor, wherein the emitters of the NPN transistor and the PNP transistor form the output of the output stage.

8. A current mirror circuit used in a coil driver circuit of a DC motor comprising:
    a first transistor having a conductive path with a first end and a second end and having a first transistor control element connected to the first end of the conductive path;
    a means for amplifying having an input connected to the first transistor control element and the first input of the first transistor, and having an output; and
    a second transistor having a conductive path and having a second transistor control element connected to the output of the amplifier so that the current flowing in the conductive path of the first transistor is mirrored in the conductive path of the second transistor.

9. The current mirror circuit of claim 8 wherein the means for amplifying comprises a unity gain amplifier.

10. The current mirror circuit of claim 8 wherein the means for amplifying comprises an amplifier with a bandwidth of 80 MHz.

11. The current mirror circuit of claim 8 wherein the means for amplifying comprises an amplifier with a low output impedance.

12. The current mirror circuit of claim 8 wherein the means for amplifying further comprises:

an input stage for receiving an input signal;

an output stage connected to the input stage for buffering the input signal; and a bias circuit for providing bias circuit to the input stage and the output stage.

13. The current mirror circuit of claim 12 wherein the input stage comprises a PNP transistor and a NPN transistor, wherein the base of the PNP transistor and the base of the NPN transistor receive the input signal.

14. The current mirror circuit of claim 12 wherein the output stage comprises a NPN transistor and a PNP transistor, wherein the emitters of the NPN transistor and the PNP transistor form the output of the output stage.

15. A disk drive system having a stator, a rotor, a commutation circuit, a means for determining the position of the rotor, and a plurality of driver circuits, each driver circuit comprises at least one current mirror comprising:

a first transistor having a conductive path with a first end and a second end and having a first transistor control element connected to the first end of the conductive path;

an amplifier having an input connected to the first transistor control element and the first input of the first transistor, and having an output; and a second transistor having a conductive path and having a second transistor control element connected to the output of the amplifier so that the current flowing in the conductive path of the first transistor is mirrored in the conductive path of the second transistor.

16. The current mirror circuit of claim 15 wherein the amplifier comprises a unity gain amplifier.

17. The current mirror circuit of claim 15 wherein the amplifier comprises an amplifier with a bandwidth of 80 MHz.

18. The current mirror circuit of claim 15 wherein the amplifier comprises an amplifier with a low output impedance.

19. The current mirror circuit of claim 15 wherein the amplifier further comprises:

an input stage for receiving an input signal;

an output stage connected to the input stage for buffering the input signal; and a bias circuit for providing bias circuit to the input stage and the output stage.

20. The current mirror circuit of claim 19 wherein the input stage comprises a PNP transistor and a NPN transistor, wherein the base of the PNP transistor and the base of the NPN transistor receive the input signal.

21. The current mirror circuit of claim 19 wherein the output stage comprises NPN transistor and a PNP transistor, wherein the emitters of the NPN transistor and the PNP transistor form the output of the output stage.

* * * * *